(12) United States Patent
Ohashi et al.

(10) Patent No.: US 11,006,558 B2
(45) Date of Patent: May 11, 2021

(54) MOUNTING MANAGEMENT DEVICE

(71) Applicant: FUJI CORPORATION, Chiryu (JP)

(72) Inventors: Teruyuki Ohashi, Anjo (JP); Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 385 days.

(21) Appl. No.: 15/554,255

(22) PCT Filed: Mar. 5, 2015

(86) PCT No.: PCT/JP2015/056471
§ 371 (c)(1),
(2) Date: Aug. 29, 2017

(87) PCT Pub. No.: WO2016/139793
PCT Pub. Date: Sep. 9, 2016

(65) Prior Publication Data
US 2018/0084684 A1     Mar. 22, 2018

(51) Int. Cl.
*H05K 13/04* (2006.01)
*H05K 13/02* (2006.01)
(Continued)

(52) U.S. Cl.
CPC ............ *H05K 13/04* (2013.01); *G06Q 10/00* (2013.01); *G06Q 50/04* (2013.01);
(Continued)

(58) Field of Classification Search
CPC .. H05K 13/04; H05K 13/0882; H05K 13/086; H05K 13/0015; H05K 13/0417; H05K 13/02
See application file for complete search history.

(56) References Cited

U.S. PATENT DOCUMENTS

| 5,155,679 A | * | 10/1992 | Jain ................. G05B 19/41865 |
| | | | 700/106 |
| 5,170,554 A | * | 12/1992 | Davis ................. H05K 13/085 |
| | | | 29/832 |

(Continued)

FOREIGN PATENT DOCUMENTS

DE    10 2012 221 258 A1    5/2014
EP    0 478 360 A1    4/1992
(Continued)

OTHER PUBLICATIONS

International Search Report dated May 12, 2015 in PCT/JP2015/056471 filed Mar. 5, 2015.

(Continued)

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

A mounting management device sets a production job of production jobs having a largest production parameter to a production job of the production jobs having an Nth largest production parameter as reference jobs of each of N groups, respectively; determines arrangement positions of tape feeders on a pallet so that a production time required for processing each of the reference jobs is as short as possible as determined based upon the arrangement positions of the tape feeders; allocates remaining production jobs excluding the reference jobs of the production jobs to the N groups; and determines arrangement positions of the tape feeders on the pallet based on the remaining production jobs.

20 Claims, 6 Drawing Sheets

(51) Int. Cl.
  *H05K 13/08* (2006.01)
  *G06Q 50/04* (2012.01)
  *G06Q 10/00* (2012.01)
  *H05K 13/00* (2006.01)

(52) U.S. Cl.
  CPC ......... *H05K 13/0015* (2013.01); *H05K 13/02* (2013.01); *H05K 13/0417* (2013.01); *H05K 13/085* (2018.08); *H05K 13/086* (2018.08); *H05K 13/0853* (2018.08); *H05K 13/0882* (2018.08)

(56) References Cited

U.S. PATENT DOCUMENTS

| | | | |
|---|---|---|---|
| 5,371,940 A | 12/1994 | Suzuki et al. | |
| 6,289,582 B1* | 9/2001 | Maenishi | H05K 13/085 29/832 |
| 7,395,129 B2* | 7/2008 | Yamazaki | H05K 13/085 700/104 |
| 8,042,266 B2* | 10/2011 | Isoda | H05K 13/0038 29/832 |
| 2003/0078676 A1* | 4/2003 | Kuribayashi | G05B 19/4097 700/1 |
| 2004/0073322 A1* | 4/2004 | Maenishi | H05K 13/0452 700/28 |
| 2013/0010101 A1* | 1/2013 | Yamasaki | H05K 13/0413 348/92 |
| 2015/0248314 A1* | 9/2015 | Morita | G05B 19/41865 718/104 |
| 2018/0148289 A1* | 5/2018 | Oyama | H05K 13/0215 |
| 2019/0230832 A1* | 7/2019 | Ohashi | G06Q 10/0875 |

FOREIGN PATENT DOCUMENTS

| | | | | |
|---|---|---|---|---|
| EP | 1282350 A1 | * | 2/2003 | ......... H05K 13/0812 |
| EP | 2 897 009 A1 | | 7/2015 | |
| JP | 7-256532 A | | 10/1995 | |
| JP | 2003-37398 A | | 2/2003 | |
| JP | 2015-082494 | * | 2/2005 | |
| JP | 2005-159160 A | | 6/2005 | |
| JP | 2009-111106 A | | 5/2009 | |
| WO | WO 2014/041640 A1 | | 3/2014 | |
| WO | 2014/068712 A1 | | 5/2014 | |

OTHER PUBLICATIONS

Extended European Search Report dated Feb. 16, 2018 in Patent Application No. 15883960.5, citing documents AA-AC, AO-AR and AX-AY therein, 12 pages.

Kari Salonen, "Setup Optimization in High-Mix Surface Mount PCB Assembly", URL:https://www.doria.fi/bitstream/handle/10024/42449/disskarisalonen091008d.2.bgt.pdf [Retrieved on Jul. 7, 2015], TUCS Dissertations, XP055200719, 2008, 71 pages.

William Edward Swaim, "SMT Line Improvements for High Mix, Low Volume Electronics Manufacturing", URL:http//etd.auburn.edu/bitstream/handle/10415/2645/SMT%20Line%20Improvements%20for%20High%20Mix,%20Low%20Volume%20Electronics%20Manufacturing%20William%20Swaim.pdf [retrieved on Jul. 7, 2015], Auburn University, XP055200759, 2011, pp. 1-90 with cover pages.

* cited by examiner

MOUNTING MANAGEMENT DEVICE

TECHNICAL FIELD

The present invention relates to a mounting management device.

BACKGROUND ART

In the related art, a component mounting apparatus is known as a device that picks up components from a component supply tape delivered to a component supply position with a head nozzle and mounts the components on a board. Here, the component supply tape is supplied to the component supply position by a tape feeder. The tape feeder is held in a state of being inserted into a slot on a pallet of the component mounting apparatus. When multiple component mounting apparatuses are arranged in a row to build a mounting line, the component mounting apparatus is also known to manufacture various boards in a many-types-small-quantity-production way. In a case of the many-type-small-quantity-production, a method of performing grouping has also been proposed. For example, PTL 1 discloses that grouping to combine orders (production jobs) of large and small lot quantities (the numbers of production) is performed.

CITATION LIST

Patent Literature

PTL 1: JP-A-7-256532

SUMMARY OF INVENTION

Technical Problem

PTL 1 discloses grouping to combine orders of large and small lot quantities, but does not disclose how to deal with the time required for producing one board for an order of a large lot quantity. For the order of the large lot quantity, if the time required for producing one board becomes slightly longer, the time required for processing the order in the group becomes significantly larger as the lot quantity is large. For this reason, production efficiency is likely to be reduced.

The present invention has been developed in order to solve the above problem, and an objective of the present invention is to reduce the total time required for processing a production job in a group.

Solution to Problem

According to one aspect of the present invention, there is provided a mounting management device for managing a mounting line including at least one component mounting apparatus that picks up components from component supply tapes sequentially fed by multiple tape feeders held in a pallet with a nozzle and mounts the components on a board, the mounting management device including: storage means for storing multiple production jobs having information on which type of component is to be mounted on the board and information on a production volume; group number setting means for setting the number of groups to N (N is a natural number); and feeder position determination means for setting a production job having a largest production volume to a production job having a Nth largest production volume of the multiple production jobs to reference jobs of N groups respectively and determining arrangement positions of the tape feeders on the pallet so that a production time required for processing the reference job is reduced based on the reference job, and performing grouping to allocate remaining production jobs excluding the reference jobs from the multiple production jobs to one of the N groups and determining arrangement positions of the tape feeders on the pallet based on the remaining production jobs.

In the mounting management device of the present invention, the arrangement positions of the tape feeders on the pallet are determined so that the production time of the production job having the largest production volume among the production jobs in the group is reduced. Since a production job having a large production volume occupies a large proportion of the total production time required for processing the production jobs in the group, the total production time can be reduced by the production job.

In addition, with regard to the process of determining the arrangement positions of the tape feeders based on the reference job and the process of grouping the remaining production jobs, the feeder position determination means may perform either of them first or may perform both of them simultaneously.

In the mounting management device of the present invention, the group number setting means may set the number of groups to N based on the total number of component types included in the multiple production jobs and the number of slots holding the tape feeders included in the mounting line. In this way, it is possible to automatically set the number of groups. However, the setting means may set the number of groups to a value that is input by an operator using an input device.

In the mounting management device of the present invention, the feeder position determination means may perform the grouping so that the remaining production jobs of which component types have high commonality with the component type of the reference job are preferentially grouped into the same group. In this way, since the jobs with high commonality in the component type are grouped into the same group, the number of tape feeders can be reduced, the number of operations for arranging the tape feeder can be reduced, and the preparation time for production can be reduced.

In the mounting management device of the present invention, the feeder position determination means may increment the number of N by one and perform the grouping again in a case where all of the multiple production jobs are not grouped eventually. In this way, in a case where the set number of groups is insufficient, it is possible to end the grouping by automatically incrementing the number of groups.

In the mounting management device of the present invention, the number of production of the board after mounting the components may be used as the production volume. Since the production time becomes longer as the number of production increases, when the production number is employed as the production volume, it is possible to reduce the total production time. Alternatively, the production time required for processing the production job may be used as the production volume. When the production time is employed as the production volume, it is possible to reduce the total production time. In addition, the production time can be obtained, for example, by obtaining the production time per board and multiplying the production time per board by the number of production.

DESCRIPTION OF EMBODIMENTS

Figure 1:
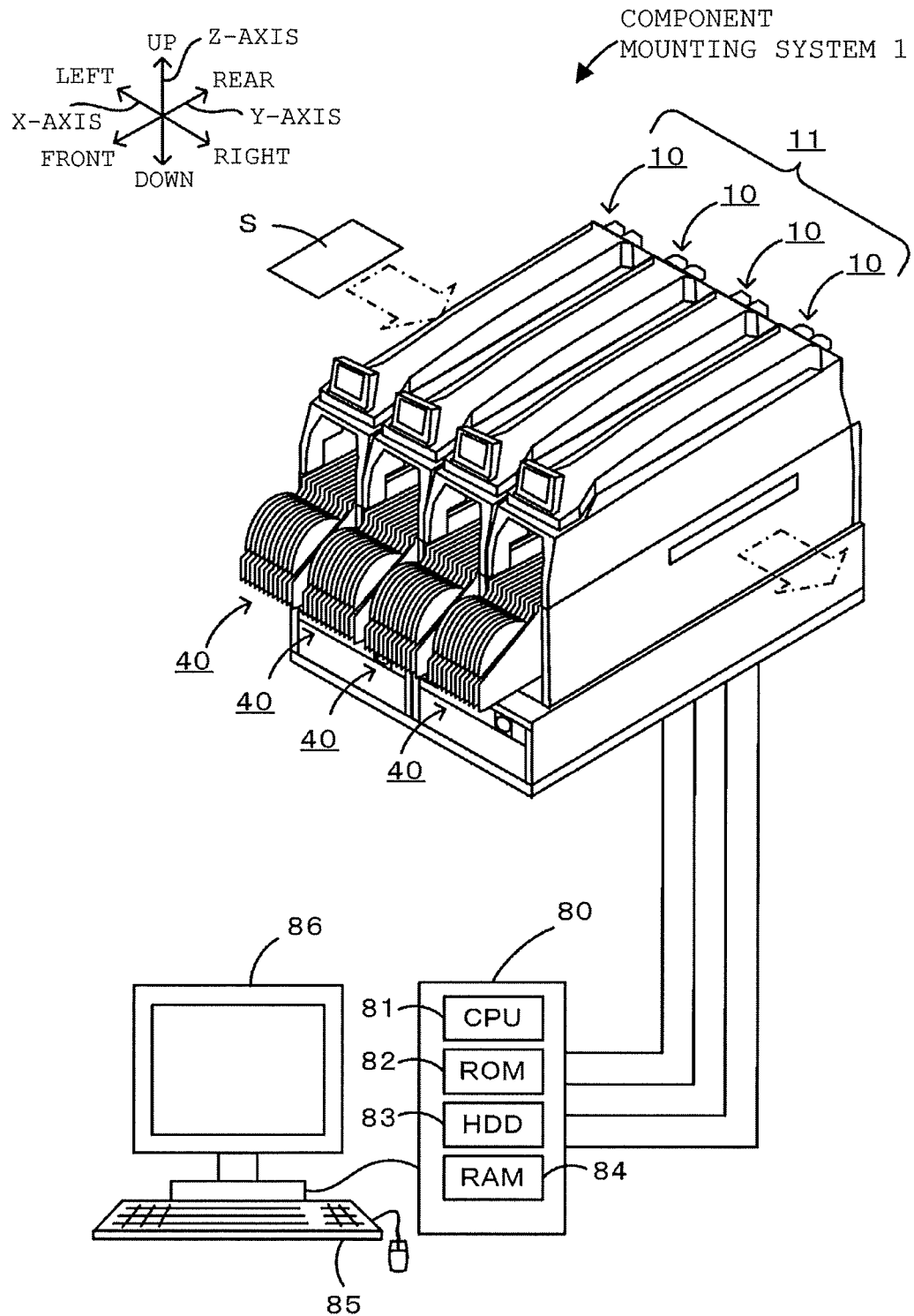
FIG. 1 is a schematic explanatory view of a component mounting system 1.
Figure 2:
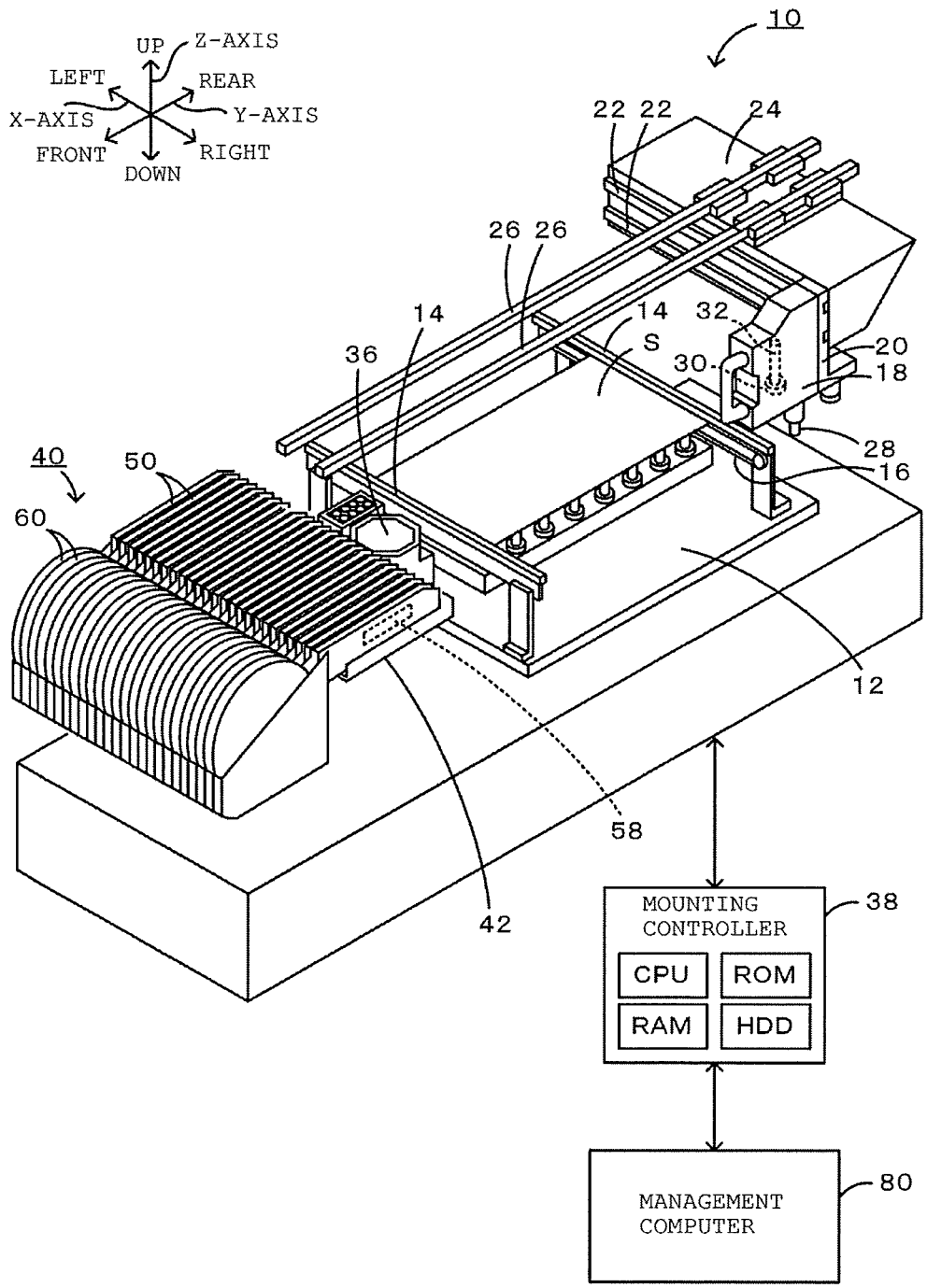
FIG. 2 is a perspective view of a component mounting apparatus 10.
Figure 3:
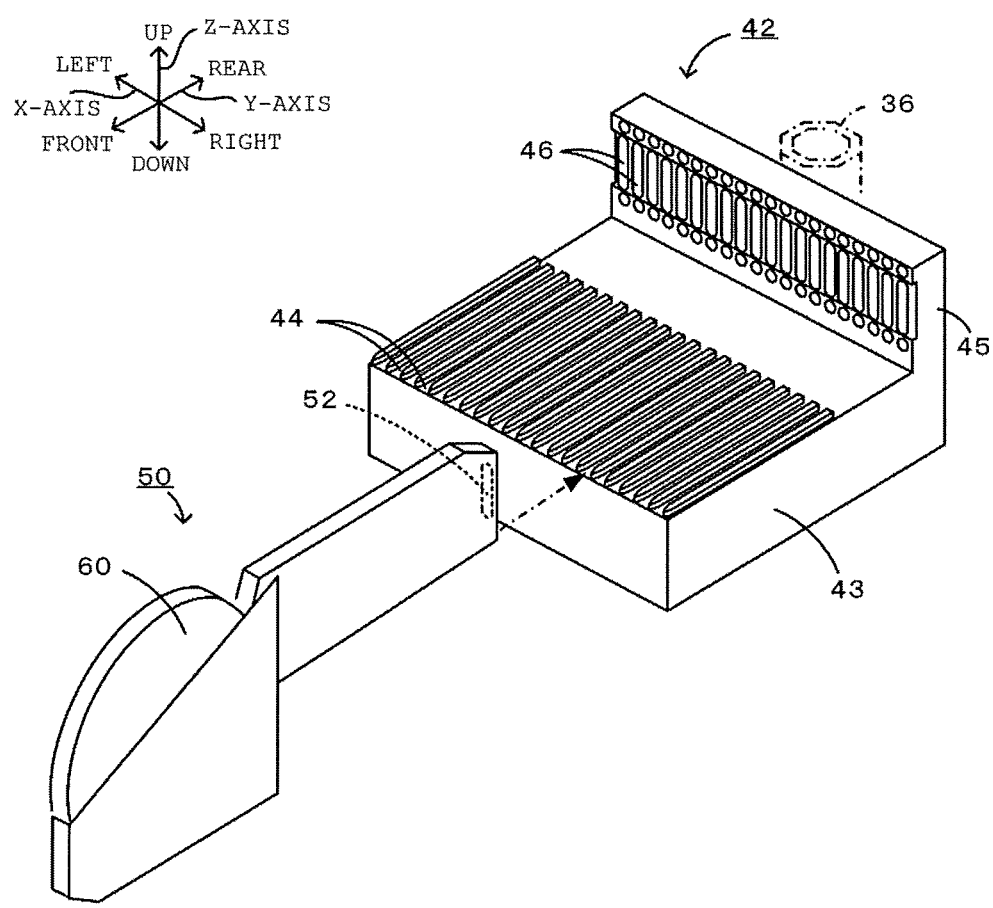
FIG. 3 is a perspective view of a device pallet 42.
Figure 4:
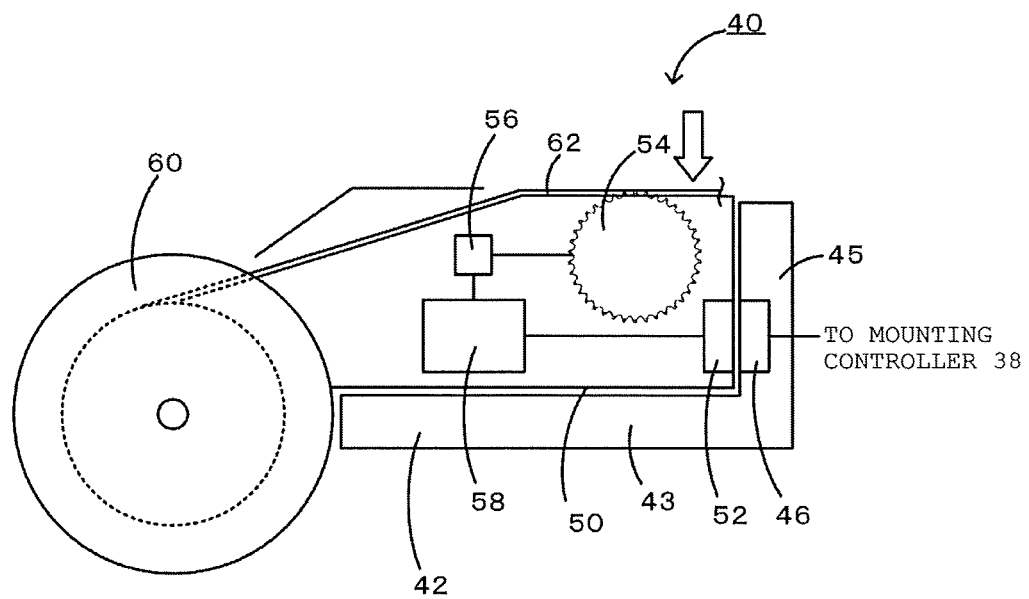
FIG. 4 is a schematic explanatory view of a reel unit 40.
Figure 5:
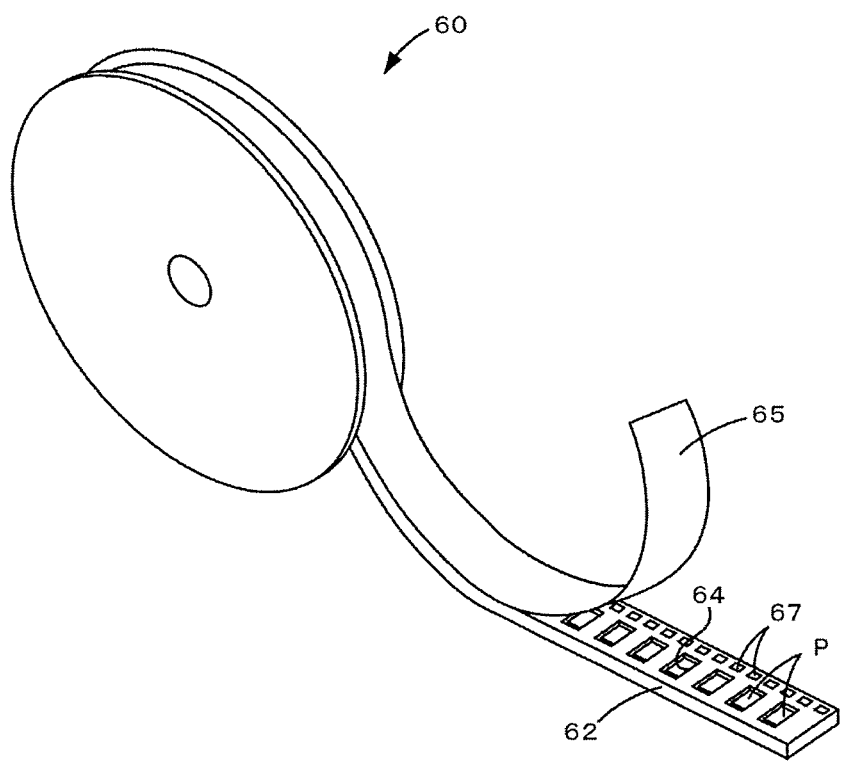
FIG. 5 is a perspective view of a reel 60.

A preferred embodiment of the present invention will be described below with reference to the drawings. FIG. 1 is a schematic explanatory view of a component mounting system 1, FIG. 2 is a perspective view of a component mounting apparatus 10, FIG. 3 is a perspective view of a device pallet 42, FIG. 4 is a schematic explanatory view of a reel unit 40, and FIG. 5 is a perspective view of a reel 60. In the present embodiment, the left-right direction (X-axis), the front-back direction (Y-axis) and the up-down direction (Z-axis) are as shown in FIGS. 1 to 3.

As shown in FIG. 1, the component mounting system 1 includes multiple component mounting apparatuses 10 configured to form a mounting line 11, reel units 40 for supplying components to component mounting apparatuses 10, respectively, and a management computer 80 for managing the production of a board S. In the mounting line 11, the component mounting apparatuses 10 sequentially mount components supplied from each reel unit 40 on the board S sent from the upstream side, and after finishing mounting, the board S is delivered to the downstream side.

As shown in FIG. 2, the component mounting apparatus 10 includes a board conveyance device 12, a head 18, a nozzle 28, a parts camera 36, and a mounting controller 38 for performing various controls.

The board conveyance device 12 transports the board S from left to right by conveyor belts 16 and 16 (only one of them is illustrated in FIG. 2) attached to a pair of left and right supporting boards 14 and 14, respectively.

The head 18 is movable in the XY-plane. Specifically, the head 18 moves in the left-right direction as an X-axis slider 20 moves in the left-right direction along guide rails 22 and 22, and moves in the front-back direction as a Y-axis slider 24 moves in the front-back direction along guide rails 26 and 26.

The nozzle 28 uses pressure to suck a component to a tip portion of the nozzle and to separate the component sucked by a tip portion of the nozzle. To this end, a pressure adjustment device (not illustrated) is connected to the nozzle 28. The height of the nozzle 28 is adjusted by a Z-axis motor 30 built in the head 18 and a ball screw 32 extending along the Z-axis.

The parts camera 36 is installed between the reel unit 40 and the board conveyance device 12 approximately in the middle of the length in the left-right direction so that the imaging direction is the up direction. The parts camera 36 captures an image of the component sucked by the nozzle 28 passing over the parts camera 36 and outputs the image obtained by capturing to the mounting controller 38.

The mounting controller 38 is configured with a microprocessor including a Central Processing Unit (CPU) as a main unit, and includes a Read Only Memory (ROM) for storing processing programs, a Hard Disk Drive (HDD) for storing various data, and a Read Access Memory (RAM) used as a work area, or the like. Above-mentioned elements are electrically connected to one another through a bus (not illustrated). The mounting controller 38 is connected so as to be capable of bidirectional communication with a feeder controller 58 of tape feeders 50 (hereinafter, referred to as feeders 50) and the management computer 80. In addition, the mounting controller 38 is connected so as to be capable of outputting control signals to the board conveyance device 12, the X-axis slider 20, the Y-axis slider 24, the Z-axis motor 30, a pressure adjustment device (not illustrated) of the nozzle 28, and the like, and is connected so as to be capable of receiving images from the parts camera 36.

The reel unit 40 includes a device pallet 42, feeders 50, and reels 60, and is detachably attached to the component mounting apparatus 10. As illustrated in FIG. 3, the device pallet 42 includes a pallet main body 43 on a flat plate and a standing wall 45 provided at the rear end of the pallet main body 43. On the pallet main body 43, multiple slots 44 formed as grooves extending in the front-back direction are provided side by side in the left-right direction. On the front face of the standing wall 45, multiple pallet-side connectors 46 are provided side by side in the left-right direction, each corresponding to one of the slots 44. The feeder 50 is held in the device pallet 42 in a state of being inserted into the slot 44. When the feeder 50 is inserted from the front to the rear of the slot 44, a feeder-side connector 52 provided on the rear end face of the feeder 50 is electrically connected to the pallet-side connector 46. As a result, as illustrated in FIG. 4, the feeder controller 58 built in the feeder 50 is capable of bidirectionally communicating with the mounting controller 38. The feeder 50 has a sprocket 54 that is rotationally driven by a feeder motor 56. The reel 60 is rotatably attached to the front portion of the feeder 50. A tape 62 is wound around the reel 60. The tape 62 is fed rearward by the sprocket 54 built in the feeder 50. As illustrated in FIG. 5, multiple recessed sections 64 are formed on the tape 62 so as to be aligned in the longitudinal direction of the tape 62. In each of the recessed sections 64, a component P is accommodated. The component P is protected by a film 65 covering the surface of the tape 62. In the feeder 50, a component suction position is determined (the position indicated by a white arrow in FIG. 4). The component suction position is a position determined by design, where the nozzle 28 sucks the component P. When the feeder motor 56 rotates the sprocket 54 in a clockwise direction in FIG. 4, sprocket holes 67 of the tape 62 are forced to move rearward by the sprocket 54 and the components P accommodated in the tape 62 are sequentially delivered to the component suction position. Since the component P that has reached the component suction position is mounted at a predetermined position on the board S with the nozzle 28, the components P are not accommodated in recessed sections 64 behind the component suction position. The component P is configured so that the film 65 covering the surface of the component P is removed when the component P reaches the component suction position. In addition, the tape 62 is cut at a position further behind than an empty recessed section 64 and the cut part of the tape is discarded.

As illustrated in FIG. 1, the management computer 80 is a microprocessor including the CPU 81 as a main unit, and includes the ROM 82 for storing the processing program, the HDD 83 for storing the production program of the board, and the RAM 84 used as a work area, or the like. Above-mentioned elements are electrically connected to one another through a bus (not illustrated). In the management computer 80, an input signal is input from an input device 85 such as a mouse or a keyboard, and an image signal is output from the management computer 80 to a display 86. The management computer 80 is connected to the mounting controller 38 of each of the component mounting apparatuses 10 that constitute the mounting line 11 so as to bidirectionally communicate with the mounting controller 38. The production job is stored in the HDD 83 of the management computer 80. Therefore, the HDD 83 corresponds to the storage means of the present invention. Here, the "production job" includes information regarding the components, such as which types of components are to be mounted on the boards S in what order, information regarding the number of production such as how many boards S on which components are mounted according to the above-mentioned information are to be produced, and the like. The "production job" is hereinafter simply referred to as "job".

Next, an operation in which the mounting controller 38 of the component mounting apparatus 10 mounts components on the board S based on a job will be described. First, the mounting controller 38 carries the board S from the upstream side. Next, the mounting controller 38 operates the nozzle 28 of the head 18 so as to suck a component supplied from the feeder 50 of the reel unit 40. Specifically, the mounting controller 38 controls the X-axis slider 20 and the Y-axis slider 24 to move the nozzle 28 directly above the component suction position of a desired component. Next, the mounting controller 38 controls the Z-axis motor 30 and the pressure adjustment device (not illustrated) of the nozzle 28 so that the nozzle 28 is lowered and negative pressure is supplied to the nozzle 28. In this way, the desired component is sucked by the tip portion of the nozzle 28. Thereafter, the mounting controller 38 raises the nozzle 28 and controls the X-axis slider 20 and the Y-axis slider 24 to move the nozzle 28 sucking the component to the tip portion above a predetermined position of the board S. The nozzle 28 sucking the component passes over the parts camera 36 during the movement and is imaged by the parts camera 36. The mounting controller 38 determines whether or not the component is sucked by the nozzle 28 based on the image captured by the parts camera 36, and determines the shape, size, and suction position of the component. When the nozzle that has sucked the component reaches a predetermined position on the board S, the mounting controller 38 lowers the nozzle 28, and performs a control so as to supply atmospheric pressure to the nozzle 28. With this, the component that has been sucked by the nozzle 28 is separated and mounted at the predetermined position of the board S. Other components to be mounted on the board S are mounted on the board S in the similar way, and when the all components are mounted on the board S, the board S is delivered to the downstream side. In the mounting line 11, when the component mounting apparatus 10 on the upstream side completes the component mounting on the board S, the board S is sent to the component mounting apparatus 10 on the downstream side, and the component mounting apparatus 10 on the downstream side performs the component mounting on the board S. When the board S passes through all of the component mounting apparatuses 10 from the uppermost stream to the downmost stream of the mounting line 11, it is considered that the mounting of all predetermined components on the board is complete.

Hereinafter, a procedure for determining how the feeders 50 necessary for the multiple jobs are to be arranged in which slots 44 on the device pallets 42 of all the component mounting apparatuses 10 constituting the mounting line 11 by the management computer 80 will be described.

Before describing the procedure, a basic idea when determining the arrangement of the feeders 50 will be described. The nozzle 28 sucks a component supplied from the feeders 50, passes over the parts camera 36, and then heads towards the board S. In consideration of this, the closer to the parts camera 36 the feeder 50 is, the shorter the nozzle movement distance is. Further, the shorter the nozzle movement distance, the shorter the nozzle movement time. Therefore, among the feeders 50 arranged in the slots 44, the closer to the parts camera 36 the feeder (the closer to the center of the lateral length of the component mounting apparatus 10) is, the shorter the time required for mounting one component is. Here, a case where the number of production of a job A is much greater than that of a job B is considered. In this case, two arrangement procedures are considered. In one procedure, multiple feeders 50 to be used for the job B are arranged in the slots 44 near the parts camera 36, and then multiple feeders 50 to be used for the job A are arranged in the remaining slots 44 (first procedure). In the other procedure, multiple feeders 50 to be used for the job A are arranged in the slots 44 near the parts camera 36, and then multiple feeders 50 to be used for the job B are arranged in the remaining slots 44 (second procedure). The production time per board in the job B is shorter in the first procedure than in the second procedure, and the production time per board in the job A is shorter in the second procedure than in the first procedure. However, considering the total production time, since the number of production of the job A is much greater than that of the job B, it is advantageous to select the second procedure.

Next, "setup changing" will be described below. For example, a case of processing the job A for mounting k types of components (k is an integer of 2 or more) on the board S, the job B for mounting m types of components (m is an integer of 2 or more) on the board S, and a job C for mounting n types of components (n is an integer of 2 or more) on the board S is considered. In this case, if it is possible to install (k+m+n) types of feeders 50 in the device pallets 42 (for convenience, referred to as one set of device pallets 42) of all the component mounting apparatuses 10 constituting the mounting line 11, the jobs A to C can be processed by setting up various types of feeders 50 on one set of device pallets 42 once. However, if (k+m+n) types of feeders 50 cannot be installed using one set of device pallets 42, it is necessary to change the setup during processing. This work is referred to as "setup changing". For example, it may be possible to install k types of feeders 50 in one set of device pallets 42, install m types of feeders 50 in one set of device pallets 42 and install n types of feeders 50 in one set of device pallets 42. In this case, it may be considered that k types of feeders 50 are first set up in one set of device pallets 42 to process the job A, then m types of feeders 50 are set up in one set of device pallets 42 again to process the job B, and then n types of feeders 50 are set up in one set of device pallets 42 again to process the job C. The number of setup changing performed during processing is two. On the other hand, it may also be possible to install (k+m) types of feeders 50 on one set of device pallets 42 and to install n types of feeders 50 on one set of device pallets 42. In this case, (k+m) types of feeders 50 are first set up on one set of device pallets 42 to process the jobs A and B, then n types of feeders 50 are set up on one set of device pallets 42 again to process the job C. The number of setup changing performed during processing is one. The time required for setup changing is relatively long. Therefore, the smaller the number of setup changing performed during processing, the shorter the time required for processing all jobs. In recent years, there has been a tendency for many-types-small-quantity-production. With this tendency, it is rare to process all jobs by only one setup. In this case, it is advantageous to reduce the number of setup changing as much as possible in production efficiency.

Figure 6:
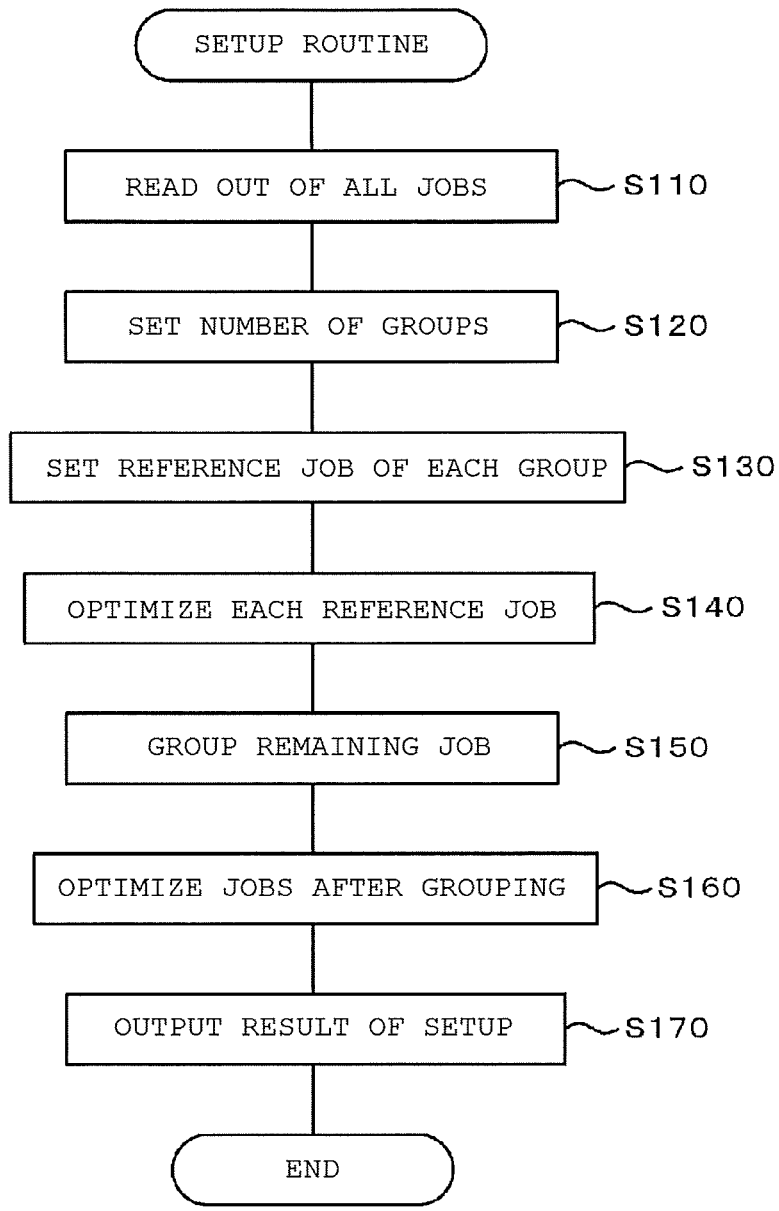
FIG. 6 is a flowchart of a setup routine.
Figure 7:
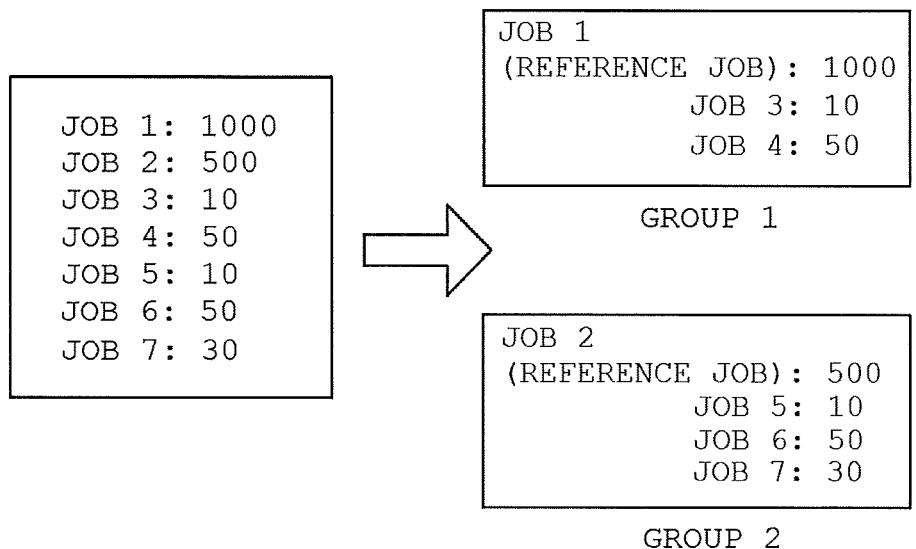
FIG. 7 is an explanatory view showing an aspect of grouping production jobs of a present embodiment.

Under consideration of the point discussed above, a procedure for the management computer 80 determining how the feeders 50 necessary for the multiple jobs are to be arranged in which slots 44 of the device pallets 42 of all the component mounting apparatuses 10 constituting the mounting line 11 will be described below with reference to a flowchart of a setup routine in FIG. 6. FIG. 7 is also referred to where appropriate. FIG. 7 is an explanatory view showing an aspect of grouping production jobs.

The CPU 81 of the management computer 80 starts the setup routine when the setup routine is input through the input device 85. Upon starting the setup routine, the CPU 81 first reads all jobs to be processed for this time from the HDD 83 (step S110). Here, it is assumed that jobs 1 to 7 on the left side of FIG. 7 are read. Each job includes information regarding components, such as which types of components are to be mounted on the board S in what order, information regarding production numbers such as how many boards S on which components are mounted according to the above-mentioned information are to be produced, and the like, but in FIG. 7 only the numbers of production are shown.

Next, the CPU 81 of the management computer 80 sets the number of groups (step S120). "Group" means a group of jobs set up on the same set of device pallets 42. Here, the CPU sets the number of groups to the number estimated by calculation. For example, the CPU 81 sets the number of groups to an integer value obtained by dividing the total number of component types in all jobs that have been read by the total number of the slots 44 included in one set of device pallets 42 and rounding up the divided number after the decimal point. Hereinafter, for convenience of description, it is assumed that the number of groups is set to N (N is a natural number, and 2 in FIG. 7, for example).

Next, the CPU 81 of the management computer 80 sets the reference job of each group (step S130). Here, among all jobs that have been read, the CPU 81 sets a job having the largest number of production to a job having the Nth largest number of production to reference jobs of the first group, the second group, . . . , the Nth group, respectively. In the example of FIG. 7, JOB 1 of which the number of production is 1000 is set to the reference job of GROUP 1, and JOB 2 of which the number of production is 500 is set to the reference job of GROUP 2.

Next, the CPU 81 of the management computer 80 performs optimization of each reference job (step S140). Here, the CPU sequentially determines the arrangement positions of multiple types of feeders 50 to be used for each reference job, but at this time, the arrangement positions of the feeders 50 on one set of device pallet 42 are determined so that the production time of the reference job is as short as possible. For example, the CPU 81 arranges multiple types of feeders 50 to be used for the reference job in the slots 44 close to the parts camera 36. The reason for this is already stated in the basic idea when determining the arrangement of the feeders 50. In this case, as the number of the same type of components to be mounted on the board is large, the feeders 50 become arranged closer to the parts camera 36. Since such components are conveyed to the board S many times by the nozzle 28, reducing the nozzle movement distance of the component contributes greatly to the reduction of production time. In the example of FIG. 7, JOB 1 is optimized in GROUP 1 and JOB 2 is optimized in GROUP 2.

Next, the CPU 81 of the management computer 80 performs grouping of the remaining jobs (step S150). Here, the CPU 81 performs grouping so that the remaining jobs of which component types have a high common degree (commonality) with the component type of the reference job are preferentially grouped into the same group. In the example of FIG. 7, the component type is not described. However, from the point of view of the type of the component to be used for a job, JOB 3 and JOB 4 have high commonality with JOB 1, and JOB 5, JOB 6 and JOB 7 have high commonality with JOB 2. Therefore, JOB 3 and JOB 4 are divided into GROUP 1, and JOB 5, JOB 6 and JOB 7 are divided into GROUP 2.

Next, the CPU 81 of the management computer 80 performs optimization of jobs other than the reference job among jobs after grouping (step S160). For multiple types of feeders 50 used for the reference job of each group, the arrangement positions have already been determined. Therefore, the CPU 81 determines the arrangement positions of multiple types of feeders 50 to be used for the remaining jobs among empty slots 44. However, the feeders 50 of the same type (that is, common) as the feeders 50 to be used for the reference job have arrangement positions that have already been determined, and hence are excluded from target objects here. In this case, the CPU 81 performs optimization of the jobs so that the production times of the component mounting apparatuses 10 constituting the mounting line 11 can be as even as possible. Alternatively, the feeders 50 to be used for a job may be arranged in order from the job having the largest production volume (for example, the number of production) out of the remaining jobs.

Next, the CPU 81 of the management computer 80 outputs the result of the setup (step S170). For example, as shown on the right side of FIG. 7, which represents the result of the setup, the CPU 81 displays information for indicating which jobs are grouped into each of GROUP 1, 2, . . . , N, and information for indicating which job is the reference job on the display 86, and outputs the two pieces of information to each mounting controller 38. After performing step S170, the CPU 81 ends the setup routine.

Here, a correspondence relationship between constituent elements of the present embodiment and those of the present invention is clarified. The management computer 80 of the present embodiment corresponds to the mounting management device of the present invention, the HDD 83 corresponds to the storage means, and the CPU 81 corresponds to the group number setting means and the feeder position determination means.

Figure 8:
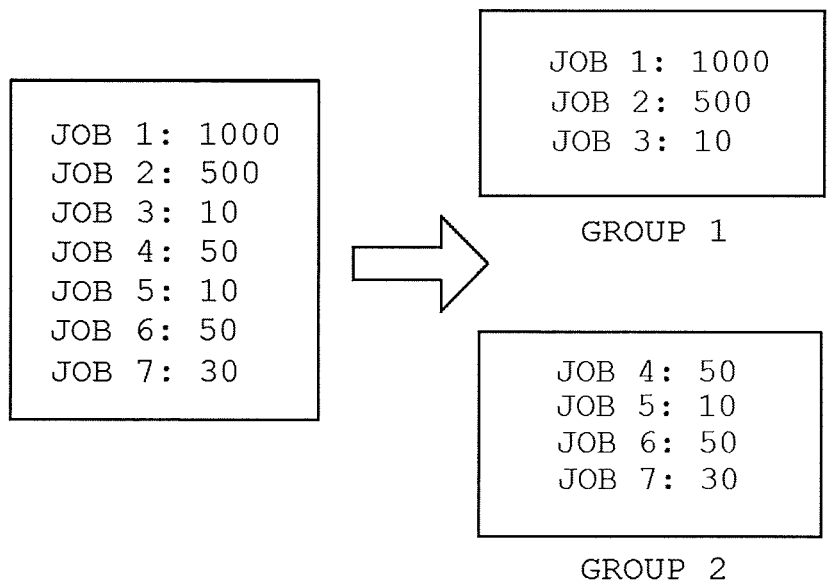
FIG. 8 is an explanatory view showing an aspect of grouping of production jobs of a comparative embodiment.

In the management computer 80 described above, the arrangement positions of the feeders 50 on one set of device pallets 42 are determined so that the production time of the job having the largest production volume (in the present embodiment, the number of production) among jobs in the group is reduced. Since the production time of the job having the largest production volume occupies a large proportion of the total production time required for processing jobs in the group, the reduction of total production time of the job can be resulted. One example is shown in FIG. 7. On the other hand, when JOB 1 to JOB 7 similar to those in FIG. 7 are grouped as shown in FIG. 8, production efficiency is lowered. That is, in GROUP 1 in FIG. 8, the arrangement positions of the feeders 50 on one set of device pallets 42 are determined so that the production time of JOB 1 having the largest number of production is reduced. Then, the arrangement positions of the feeders 50 of JOB 2 having the second largest number of production are limited. Therefore, the production time of JOB 2 is increased despite that JOB 2 has the second largest number of production among all jobs. In contrast, in FIG. 7, the arrangement positions of the feeders 50 on one set of the device pallets 42 are determined so that JOB 2 is in GROUP 2 and the production time of JOB 2 having the largest number of production in GROUP 2 becomes shorter. For this reason, the production time of JOB 2 becomes shorter and production efficiency of all jobs is increased compared to FIG. 8.

In addition, since the management computer 80 sets the number of groups based on the total number of component types included in multiple jobs and the total number of slots 44 included in the mounting line 11, it is possible to automatically set the number of groups.

Further, the management computer 80 performs the grouping so that, among all jobs, the remaining jobs other than the reference job, of which component types have high commonality with the component type of the reference job, are preferentially grouped into the same group. Therefore, the total number of the feeders 50 can be reduced, the number of works for arranging the feeders 50 can be reduced, and the preparation time for production can be reduced. In addition, when the total number of the feeders 50 is reduced, the configuration of the mounting line 11 can be made compact in the same number of groups, and the number of groups can be reduced in the mounting line 11 having the same configuration. As the number of groups is reduced, the number of the setup changing is reduced, and as a result, the total production time is reduced.

Furthermore, although the production number of boards after component mounting is used as the production volume, since the production time becomes longer as the number of production increases, when the production time is employed as the production volume, it is possible to reduce the total production time.

It is to be understood that the present invention is not limited to the embodiment described above, and can be implemented in various aspects as long as they fall within the technical scope of the present invention.

For example, in step S120 in the embodiment described above, the CPU 81 sets the number of groups to the number estimated by calculation, but the present invention is not particularly limited thereto. For example, a relationship between the total number of a component type and the number of groups may be stored as a table in the HDD 83 in advance. In this case, the CPU 81 may read the number of groups from the table corresponding to the total number of the component types for this time and set the number of groups to the number that has been read. Even in this way, it is possible to automatically set the number of groups. Alternatively, the CPU 81 may set the number input to the management computer 80 by an operator through the input device 85 to the number of groups. In this case, the number of groups is manually set, but the operator can set the number of groups to an arbitrary number.

In the embodiment described above, in a case where the number of groups is insufficient and eventually all the remaining jobs cannot be grouped after step S150, the number of groups may be incremented by one (that is, the number of N is incremented by one) and then the processes after step S130 may be executed again. In this way, when the set number of groups is insufficient, the number of groups is automatically incremented. Therefore it is possible to group all the remaining jobs.

In the embodiment described above, the number of production is employed as the production volume, but the production volume is not limited to the production volume and any parameter can be employed if the parameter represents the production volume. For example, the production time required for processing the job may be used as the production volume. When the production time required for processing the job is employed as the production volume, it is possible to reduce the total production time. The production time required for processing the job can be obtained, for example, by obtaining the production time per board through simulation (desk calculation) and multiplying the obtained production time per board by the number of productions. In a case where the production time per board is obtained through simulation, the production time may be obtained on the assumption that components of multiple types of the job are arranged by a predetermined component arrangement. In addition, the production time required for processing the job may be obtained by simple calculation. For example, the production time required for processing the job may be obtained by simple calculation of multiplying the time required for mounting one component (for example, a value determined by a specification such as a catalog value) by the number of mounting of the job.

In the embodiment described above, as illustrated in FIG. 6, the CPU 81 in the management computer 80 performs setting a reference job (S130), optimizing the reference job (S140), grouping remaining jobs (S150), and optimizing the remaining jobs (S160) in order, but the order of S140 and S150 may be reversed. Even in this case, a similar effect to the embodiment described above can be obtained.

In the embodiment described above, the mounting line 11 is constituted by multiple component mounting apparatuses 10, but may be constituted by one component mounting apparatus 10.

INDUSTRIAL APPLICABILITY

The present invention is useful in managing a component mounting apparatus that picks up components from component supply tapes sequentially fed by tape feeders with a nozzle and mounts the components on a board.

REFERENCE SIGNS LIST

1: component mounting system, 10: component mounting apparatus, 11: mounting line, 12: board conveyance device, 14: supporting board, 16: conveyor belt, 18: head, 20: X-axis slider, 22: guide rail, 24: Y-axis slider, 26: guide rail, 28: nozzle, 30: Z-axis motor, 32: ball screw, 36: parts camera, 38: mounting controller, 40: reel unit, 42: device pallet, 43: pallet main body, 44: slot, 45: standing wall, 46: pallet-side connector, 50: tape feeder (feeder), 52: feeder-side connector, 54: sprocket, 56: feeder motor, 58: feeder controller, 60: reel, 62: tape, 64: recessed section, 65: film, 67: sprocket hole, 80: management computer, 81: CPU, 82: ROM, 83: HDD, 84: RAM, 85: input device, 86: display

The invention claimed is:

1. A mounting management system comprising:
   at least one component mounting apparatus of a mounting line, the at least one component mounting apparatus configured with a nozzle to pick up components from component supply tapes sequentially fed by multiple tape feeders, each tape feeder being held on a pallet of a plurality of pallets, and the at least one component mounting apparatus configured to mount the components individually on a plurality of boards under control of a mounting controller; and a mounting management device including:
a memory that stores a processing program, and
at least one processor that upon executing the processing program is configured to:
- A) read job production information of all of a plurality of production jobs, each including information on which type or types of component are to be mounted on the boards and information on a production parameter;
- B) set a number of groups into which to group the production jobs to N (N is a natural number from greater than 1 to a total number of the production jobs), each of said group corresponding to production jobs set up on a same pallet;
- C) set a reference production job for each of the groups according to an Nth largest production parameter, the setting of the reference production jobs including:
  setting a first production job having a first largest production parameter as a first reference production job of a $1^{st}$ group of the N groups, and
  setting a second production job having a second largest production parameter as a second reference production job of a $2^{nd}$ group of the N groups;
- D) determine arrangement positions of the tape feeders on each of the pallets so that a production time required for processing each of the reference production jobs is less than non-reference production jobs of the same group, as determined based upon the arrangement positions of the tape feeders based upon the reference production jobs;
- E) allocate remaining production jobs, excluding the reference production jobs, to the N groups such that production times of the remaining production jobs are within a predetermined amount of each other; and
- F) determine, for each of the groups, arrangement positions of the tape feeders on each of the pallets for the remaining production jobs; and
- G) output information indicating which of the production jobs are allocated to each of the groups and information indicating the reference production job for each of the groups to the mounting controller.

2. The mounting management device according to claim 1, wherein the at least one processor is configured to set N based on a total number of component types included in the production jobs and a total number of slots for holding the tape feeders included in the pallet.

3. The mounting management device according to claim 1, wherein the at least one processor is configured to allocate the remaining production jobs to the N groups based upon commonality of component type with a corresponding one of the reference jobs of a respective group of the N groups.

4. The mounting management device according to claim 1, wherein the at least one processor is configured to increment N by one and perform the processes C, D, E, and F again in a case in which all of the production jobs are not grouped.

5. The mounting management device according to claim 1, wherein a number of the boards to which the components are to be mounted is used as the production parameter.

6. The mounting management device according to claim 1, wherein a production time required for processing a respective production job is used as the production parameter.

7. The mounting management device according to claim 1, wherein the at least one processor is configured to determine the arrangement positions of the tape feeders on each of the pallets so that the production time required for processing each of respective the reference jobs is minimized by setting an arrangement position of at least one of the tape feeders to a position on a corresponding one of the pallets closest to a camera of the at least one component mounting apparatus.

8. The mounting management device according to claim 2, wherein the at least one processor is configured to set N to an integer value obtained by dividing the total number of component types included in the production jobs by the total number of slots for holding the tape feeders included in the pallet.

9. The mounting management device according to claim 3, wherein the at least one processor is configured to determine the arrangement positions of the tape feeders of the remaining production jobs such that total productions times of at least two component mounting apparatuses of the mounting line are within a predetermined amount of each other.

10. The mounting management device according to claim 3, wherein the at least one processor is configured to determine the arrangement positions of the tape feeders of the remaining production jobs in order starting from a remaining production job having a largest production parameter.

11. A device comprising:
a memory that stores a processing program; and
at least one processor that upon executing the processing program is configured to:
- A) read job production information of all of a plurality of production jobs, each including information on which type or types of component are to be mounted on a plurality of boards by at least one component mounting apparatus and information on a production parameter;
- B) set a number of groups into which to group the production jobs to N (N is a natural number from greater than 1 to a total number of the production jobs), each of said group corresponding to production jobs set up on a same pallet;
- C) set a reference production job for each of the groups according to an Nth largest production parameter, the setting of the reference production jobs including:
  setting a first production job having a first largest production parameter as a first reference production job of a $1^{st}$ group of the N groups, and
  setting a second production job having a second largest production parameter as a second reference production job of a $2^{nd}$ group of the N groups;
- D) determine arrangement positions of tape feeders on each of the pallets so that a production time required for processing each of the reference production jobs is less than non-reference production jobs of the same group, as determined based upon the arrangement positions of the tape feeders based upon the reference production jobs;
- E) allocate remaining production jobs, excluding the reference production jobs, to the N groups such that production times of the remaining production jobs are within a predetermined amount of each other;

F) determine arrangement positions of the tape feeders on the pallet based on the remaining production jobs; and G) output information indicating which of the production jobs are allocated to each of the groups and information indicating the reference production job for each of the groups to a mounting controller of the at least one component mounting apparatus in a mounting line.

12. The device according to claim 11, wherein the at least one processor is configured to set N based on a total number of component types included in the production jobs and a total number of slots for holding the tape feeders included in the pallet.

13. The device according to claim 11, wherein the at least one processor is configured to allocate the remaining production jobs to the N groups based upon commonality of component type with a corresponding one of the reference jobs of a respective group of the N groups.

14. The device according to claim 11, wherein the at least one processor is configured to increment N by one and perform the processes C, D, E, F, and G again in a case in which all of the production jobs are not grouped.

15. The device according to claim 11, wherein a number of the boards to which the components are to be mounted is used as the production parameter.

16. The device according to claim 11, wherein a production time required for processing a respective production job is used as the production parameter.

17. The device according to claim 11, wherein the at least one processor is configured to determine the arrangement positions of the tape feeders on each of the pallets so that the production time required for processing each of respective the reference jobs is minimized by setting an arrangement position of at least one of the tape feeders to a position on a corresponding one of the pallets closest to a camera of at least one component mounting apparatus.

18. The device according to claim 12, wherein the at least one processor is configured to set N to an integer value obtained by dividing the total number of component types included in the production jobs by the total number of slots for holding the tape feeders included in the pallet.

19. The device according to claim 13, wherein the at least one processor is configured to determine the arrangement positions of the tape feeders of the remaining production jobs such that total productions times of at least two component mounting apparatuses are within a predetermined amount of each other.

20. The device according to claim 13, wherein the at least one processor is configured to determine the arrangement positions of the tape feeders of the remaining production jobs in order starting from a remaining production job having a largest production parameter.

* * * * *